United States Patent
Yu et al.

(10) Patent No.: US 8,466,496 B2
(45) Date of Patent: Jun. 18, 2013

(54) SELECTIVE PARTIAL GATE STACK FOR IMPROVED DEVICE ISOLATION

(75) Inventors: Xiaojun Yu, Beacon, NY (US); Dureseti Chidambarrao, Weston, CT (US); Brian J. Greene, Wappingers Falls, NY (US); Yue Liang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 13/298,783

(22) Filed: Nov. 17, 2011

(65) Prior Publication Data

US 2013/0126976 A1    May 23, 2013

(51) Int. Cl.
*H01L 29/66* (2006.01)
*H01L 29/78* (2006.01)
*H01L 21/8238* (2006.01)
*H01L 27/092* (2006.01)

(52) U.S. Cl.
CPC *H01L 21/823871* (2013.01); *H01L 21/823878* (2013.01); *H01L 27/092* (2013.01)
USPC .............. 257/199; 257/369; 257/E21.632; 257/E27.108; 438/221

(58) Field of Classification Search
USPC .... 257/199, 369, E21.632, E27.108; 438/221
See application file for complete search history.

(56) References Cited

U.S. PATENT DOCUMENTS

| | | | |
|---|---|---|---|
| 3,651,517 A | 3/1972 | Kurek et al. | |
| 4,130,768 A | 12/1978 | Bula et al. | |
| 4,276,487 A | 6/1981 | Arzubi et al. | |
| 4,418,291 A | 11/1983 | Watson, Jr. | |
| 5,168,182 A | 12/1992 | Salerno et al. | |
| 5,612,243 A | * 3/1997 | Verrett | 438/233 |
| 5,643,822 A | 7/1997 | Furukawa et al. | |
| 5,773,328 A | 6/1998 | Blanchard | |
| 5,777,370 A | 7/1998 | Omid-Zohoor et al. | |
| 5,798,553 A | 8/1998 | Furukawa et al. | |
| 5,858,825 A | 1/1999 | Alsmeier et al. | |
| 5,874,317 A | 2/1999 | Stolmeijer | |
| 5,891,771 A | 4/1999 | Wu et al. | |
| 5,960,275 A | 9/1999 | So et al. | |
| 5,981,318 A | 11/1999 | Blanchard | |
| 5,982,017 A | 11/1999 | Wu et al. | |
| 6,081,662 A | 6/2000 | Murakami et al. | |
| 6,093,593 A | 7/2000 | Jang | |
| 6,133,116 A | 10/2000 | Kim et al. | |
| 6,228,745 B1 | 5/2001 | Wheeler et al. | |
| 6,268,629 B1 | 7/2001 | Noguchi | |

(Continued)

*Primary Examiner* — Evan Pert
(74) *Attorney, Agent, or Firm* — Scully, Scott, Murphy & Presser, P.C.; H. Daniel Schnurmann (57) ABSTRACT

A complementary metal oxide semiconductor (CMOS) device that may include a substrate having a first active region and a second active region that are separated from one another by an isolation region. An n-type semiconductor device is present on the first active region that includes a first gate structure having a first gate dielectric layer and an n-type work function metal layer, wherein the n-type work function layer does not extend onto the isolation region. A p-type semiconductor device is present on the second active region that includes a second gate structure having a second gate dielectric layer and a p-type work function metal layer, wherein the p-type work function layer does not extend onto the isolation region. A connecting gate structure extends across the isolation region into direct contact with the first gate structure and the second gate structure.

19 Claims, 5 Drawing Sheets

U.S. PATENT DOCUMENTS

| | | |
|---|---|---|
| 6,271,093 B1 | 8/2001 | Alsmeier et al. |
| 6,274,419 B1 | 8/2001 | Omid-Zohoor et al. |
| 6,284,523 B1 | 9/2001 | Daugulis et al. |
| 6,291,845 B1 | 9/2001 | Blanchard |
| 6,468,910 B1 | 10/2002 | Srinivasan et al. |
| 6,479,369 B1 | 11/2002 | Miyoshi |
| 6,482,271 B2 | 11/2002 | Sakai et al. |
| 6,491,843 B1 | 12/2002 | Srinivasan et al. |
| 6,492,220 B2 | 12/2002 | Ikeda |
| 6,537,895 B1 | 3/2003 | Miller et al. |
| 6,544,892 B2 | 4/2003 | Srinivasan et al. |
| 6,548,866 B2 | 4/2003 | Noguchi |
| 6,555,442 B1 | 4/2003 | Pai et al. |
| 6,566,224 B1 | 5/2003 | Chang et al. |
| 6,597,026 B2 | 7/2003 | Ogura |
| 6,627,101 B2 | 9/2003 | Manoharan et al. |
| 6,642,536 B1 | 11/2003 | Xiang et al. |
| 6,723,617 B1 | 4/2004 | Choi |
| 6,780,730 B2 | 8/2004 | Lin |
| 6,897,707 B2 | 5/2005 | Beck |
| 6,922,199 B2 | 7/2005 | Hunter |
| 6,960,781 B2 | 11/2005 | Currie et al. |
| 7,091,164 B2 | 8/2006 | Srinivasan et al. |
| 7,119,812 B2 | 10/2006 | Hunter |
| 7,145,577 B2 | 12/2006 | Hunter |
| 7,157,350 B2 | 1/2007 | Yang et al. |
| 7,176,104 B1 | 2/2007 | Chen et al. |
| 7,205,996 B2 | 4/2007 | Hunter |
| 7,222,060 B2 | 5/2007 | Shimizu et al. |
| 7,238,588 B2 | 7/2007 | Xiang |
| 7,369,138 B2 | 5/2008 | Hunter |
| 7,480,604 B2 | 1/2009 | Bianchi |
| 7,504,704 B2 | 3/2009 | Currie et al. |
| 7,560,775 B2 | 7/2009 | Takamura et al. |
| 7,675,526 B2 | 3/2010 | Hunter |
| 7,804,152 B2 | 9/2010 | Yeh et al. |
| 7,892,941 B2 | 2/2011 | Pan |
| 7,906,407 B2 | 3/2011 | Rossi et al. |
| 8,183,644 B1 * | 5/2012 | Chuang et al. ............ 257/388 |

* cited by examiner

SELECTIVE PARTIAL GATE STACK FOR IMPROVED DEVICE ISOLATION

BACKGROUND

The present disclosure relates generally to semiconductor devices, and more particularly to forming isolation regions adjacent to semiconductor devices that include threshold voltage modifications.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). With scaling of electrical devices potentially reaching their limits, other means of modifying device performance have been contemplated.

SUMMARY

In one embodiment, a method of forming a semiconductor device is provided that includes providing a substrate including at least one first active region that is in direct contact with at least one second active region. A first work function metal layer is formed over a first channel region of the at least one first active region of the substrate. A second work function metal layer is formed over a second channel region of the at least one second active region of the substrate. Following the formation of the first and second work function metal layers, an isolation region is formed at an interface between the at least one first active region and the at least one second active region of the substrate. The isolation region separates the first work function metal layer that is present on the at least one first active region from the second work function metal layer that is present on the at least one second active region. A gate stack is then formed spanning across the isolation region from the at least one first active region to the at least one second active region of the substrate. The gate stack is in contact with the first work function metal layer on the at least one first active region and the second work function metal layer on the second active region. The gate stack includes at least one metal nitride layer that is present on the at least the first work function metal layer and the second work function metal layer, and at least one semiconductor gate conductor layer that is present on the at least one metal nitride layer.

In another aspect, a complementary metal oxide semiconductor (CMOS) device is provided that includes a substrate including at least one first active region and at least one second active region, wherein the at least one first active region is separated from the at least one second active region by an isolation region. An n-type conductivity semiconductor device is present on the at least one first active region. The n-type conductivity semiconductor device includes a first gate stack that is present on a first channel portion of the at least one first active region. The first gate structure is comprised of a first gate dielectric layer and an n-type work function metal layers. The n-type work function layer does not extend onto the isolation region. A p-type conductivity semiconductor device is present on the at least one second active region, wherein the p-type conductivity semiconductor device includes a second gate structure that is present on a second channel portion of the at least one second active region. The second gate structure is comprised of a second gate dielectric layer and a p-type work function metal layer. The p-type work function layer does not extend onto the isolation region. A connecting gate structure extends across the isolation region into direct contact with the first gate structure and the second gate structure.

In another aspect, a complementary metal oxide semiconductor (CMOS) device is provided that includes a substrate including at least one first active region and at least one second active region. An n-type semiconductor device is present on the at least one first active region. The n-type semiconductor device includes a first gate structure that is present on a first channel region of the at least one first active region. The first gate structure may include a first gate dielectric layer and an n-type work function metal layer. A p-type conductivity semiconductor device is present on the at least one second active region. The p-type conductivity semiconductor device includes a second gate structure that is present on a second channel region of the at least one second active region. The second gate structure may include a second gate dielectric layer and a p-type work function metal layer. A connecting gate structure is in direct contact with the first gate structure and the second gate structure.

DESCRIPTION OF THE DRAWINGS

The following detailed description, given by way of example and not intended to limit the invention solely thereto, will best be appreciated in conjunction with the accompanying drawings, wherein like reference numerals denote like elements and parts.

Figures having a suffix of "a" after a figure numeral are top-down planar views. Figures having a suffix "b" after a figure numeral are side cross-sectional views along section line b-b in the figure with the same figure numeral and a suffix "a." Figures having a suffix "c" after a figure numeral are side cross-sectional views along section line c-c' in the figure with the same figure numeral and a suffix "a."

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "over" "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a method of forming a complementary metal oxide semiconductor (CMOS) structure, in which a p-type conductivity semiconductor device of the CMOS structure includes a gate structure having a p-type work function metal layer, and an n-type conductivity semiconductor device of the CMOS structure includes a gate structure having an n-type work function metal layer. A semiconductor device is an intrinsic semiconductor material that has been doped, that is, into which a doping agent has been introduced, giving it different electrical properties than the intrinsic semiconductor. A CMOS structure is a semiconductor device that includes at least one n-type conductivity semiconductor device and at least one p-type conductivity semiconductor device. In some embodiments of CMOS structures, and since either one of the p-type conductivity semiconductor device or the n-type conductivity semiconductor device is on at any given time, CMOS structures typically require less power than chips using just one type of semiconductor device, e.g., n-type or p-type semiconductor device. The term "conductivity type", e.g., "n-type conductivity semiconductor device" or "p-type conductivity semiconductor device" denote whether the source and drain region of the semiconductor device have been doped with either an n-type dopant or a p-type dopant.

The semiconductor devices disclosed herein, and method of forming thereof, use at least one of an n-type work function metal layer and a p-type work function metal layer that is incorporated into a gate structure as a means to adjust the threshold voltage of the corresponding device. As used herein, an "n-type work function metal layer" is a metal containing layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. As used herein, a "p-type work function metal layer" is a metal containing layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

It has been determined that the p-type work function metal layer and the n-type work function metal layer may allow for interdiffusion of dopants from at least one first active region that includes the n-type semiconductor devices to at least one second active region that includes the p-type semiconductor devices when the p-type work function metal and the n-type work function metal extend into contact with each other typically over an isolation region. The methods and structures disclosed herein form an isolation region through the interface between the n-type work function metal layer and the p-type work function metal layer during the process sequence that form the isolation region separating the at least one first active region from the at least one second active region. By separating the p-type work function metal layer from the n-type work function metal layer, the methods and structures disclosed herein sever the path by which dopant diffuse over the isolation region between adjacent active device regions.

Further, by forming the gate dielectric layer, the n-type work function metal layer, and the p-type work function metal layer before forming the isolation region that defines the borders of the active regions of the substrate, the method and structure disclosed herein reduce narrow channel effects that result from the effects of epitaxially growing a semiconductor material in direct contact with an isolation region. More specifically, it has been determined that the formation of oxide isolation result in divot formation at the interface between the isolation region and isolation oxide. Epitaxially grown semiconductor materials including dielectric and gate material follow divot profile conformally, resulting active-dielectric-gate structure in the divot region. This additional devices are conventionally referred to as a corner device, which effectively modulates the effective device width. The impact or corner devices varies with device width, which is a major component of narrow channel effect. Further, the interaction between the epitaxially formed semiconductor material and the isolation region results in an epitaxially formed semiconductor material having an uneven upper surface. The uneven upper surface of the epitaxially formed semiconductor material and the divots at the interface between the isolation region and the epitaxially formed semiconductor material disadvantageously impact the formation of gate structures adjacent to, or on, the epitaxially formed semiconductor material. For example, the presence of uneven upper surface of the epitaxially formed semiconductor results in a variation in the critical dimension of the gate structure, such as final gate length and spacer thickness variation, gate structure or spacer etch. In some embodiments the method and structure of the present disclosure form a partial gate structure before forming the isolation region, therefore overcoming the difficulties that result from forming a gate structure on the epitaxially formed semiconductor material after the formation of the isolation region.

Figure 1:
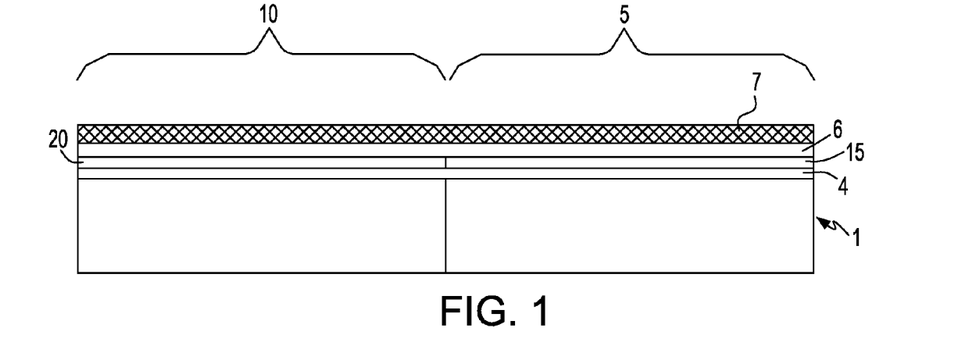
FIG. 1 is a side cross-sectional view depicting one embodiment of providing a substrate including at least one first active region that is in direct contact with at least one second active region, and forming a first work function metal layer over a first channel region of at least one first active region of the substrate, and a second work function metal layer over a second channel region of the at least one second active region of the substrate, in accordance with the present disclosure.

FIG. 1 depicts one embodiment of providing a substrate 1 including at least one first active region 5 that is in direct contact with at least one second active region 10. The substrate 1 may be composed of a silicon containing material. Silicon containing materials suitable for the substrate 1 include, but are not limited to, Si, single crystal Si, polycrystalline Si, SiGe, single crystal silicon germanium, polycrystalline silicon germanium, or silicon doped with carbon, amorphous Si and combinations and multi-layers thereof. The substrate 1 may also be composed of other semiconductor materials, such as germanium, and compound semiconductor substrates, such as type III/V semiconductor substrates, e.g., GaAs. Although the substrate 1 is depicted as a bulk semiconductor substrate, semiconductor on insulator (SOI) substrate arrangements, such as silicon on insulator substrates, are also suitable for the substrate 1.

The term "active" as used to describe the at least one first active region 5 and the at least one second active region 10 means that the designated portion of the substrate 1 contains at least the channel region, the source region and the drain region of a semiconductor device. In some embodiments, a raised source region and a raised drain region may be contained within the active region. In one embodiment, the at least one first active region 5 provides the site for a subsequently formed n-type semiconductor device, and the at least one second active region 10 provides the site for a subsequently formed p-type semiconductor device. In this example, the at least one first active region 5 may include a well region of a p-type conductivity, and the at least one second active region 10 may include a well region of an n-type conductivity. As used herein, the term "conductivity type" denotes a dopant region being p-type or n-type. As used herein, "p-type" refers to the addition of impurities to an intrinsic semiconductor that creates deficiencies of valence electrons. In a semiconductor material from group IV of the Periodic Table of Elements, such as silicon, examples of n-type dopants, i.e., impurities, include but are not limited to, boron, aluminum, gallium and indium. As used herein, "n-type" refers to the addition of impurities that contributes free electrons to an intrinsic semiconductor. In a semiconductor material from group IV of the Periodic Table of Elements, examples of n-type dopants, i.e., impurities, include but are not limited to antimony, arsenic and phosphorous. The concentration of dopant in the well region of the at least one first active region 5, and/or the at least one second active region 10 may range from 1e16 atoms/cm$^3$ to 1e20 atoms/cm$^3$.

FIG. 1 further depicts one embodiment of forming a first work function metal layer 15 (hereafter referred to as n-type work function metal layer 15) over a first channel region of at least one first active region 20 of the substrate 1, and a second work function metal layer 20 (hereafter referred to as p-type work function metal layer 20) over a second channel region of the at least one second active region 10 of the substrate 1. As used herein, the term "channel region" is the region underlying the subsequently formed gate structure and between the source and drain of a semiconductor device that becomes conductive when the semiconductor device is turned on.

Prior to forming the n-type work function metal layer 15 and the p-type work function metal layer 20, a gate dielectric layer 4 is formed on the at least one first active region 5 and the at least one second active region 10 of the substrate 1. In one embodiment, the gate dielectric layer 4 is composed of a dielectric, such as an oxide, nitride or oxynitride material. For example, the gate dielectric layer 4 may be composed of silicon oxide ($SiO_2$). In one embodiment, the gate dielectric layer 4 may be composed of a high-k dielectric material. As used herein, the term "high-k" denotes a dielectric material having a dielectric constant that is greater than the dielectric constant of silicon oxide ($SiO_2$). For example and in one embodiment, the high-k dielectric material that provides the gate dielectric layer 4 may have a dielectric constant at room temperature, e.g., 20° C. to 25° C., and atmospheric pressure, e.g., 1 atm, of 4.0 or greater. In another embodiment, the high-k dielectric material that provides the gate dielectric layer 4 has a dielectric constant that is greater than 7.0. The high k dielectric material of the gate dielectric layer 4 may include, but is not limited to, an oxide, nitride, oxynitride and/or silicate including metal silicates and nitrided metal silicates. In one embodiment, the high-k material that provides the gate dielectric layer 4 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials that are suitable for use as the gate dielectric layer 4 in the present method and structures include hafnium silicate and hafnium silicon oxynitride.

The gate dielectric layer 4 can be formed by a thermal growth process such as, for example, oxidation, nitridation or oxynitridation. The gate dielectric layer 4 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The gate dielectric layer 4 may also be formed utilizing any combination of the above processes. The gate dielectric layer 4 typically has a thickness ranging from 1 nm to 10 nm. More typically, one example, the gate dielectric layer 4 has a thickness ranging from 2 nm to 5 nm. In one embodiment, the gate dielectric layer 4 is in direct physical contact with a surface, e.g., upper surface, of the substrate 1. In some embodiments, an interfacial layer of a silicon-containing oxide, such as silicon oxide or silicon oxynitride, may be present between the gate dielectric layer 4 and the semiconductor substrate 1.

In FIG. 1 the gate dielectric layer 4 is depicted as being a single material layer having a single composition that is present over both the at least one first active region 5 and the at least one second active region 10 of the substrate 1. In some embodiments, the gate dielectric layer 4 may also be composed of multiple material layers. For example, the gate dielectric layer 4 may be a multi-layered structure in which a first gate dielectric layer is present over the at least one first active region 5 and a second gate dielectric layer is present over the second active region 10. The first gate dielectric layer may be composed of a different dielectric material composition or the same material composition as the second gate dielectric layer. In some embodiments, block masks (not shown) may be employed to provide gate dielectric layers having different dielectric material compositions separately on the at least one first active region 5 and the at least one second active region 10. The block masks are formed over a selected region of the substrate 1 in order to obstruct a deposited material from being formed thereon. The block masks may be composed of hardmask dielectric materials, such as silicon oxide ($SiO_2$) or silicon nitride ($Si_3N_4$), or may be composed of softmask materials, such as photoresist, and may be formed using deposition, photolithography and etching. Selective etching may be employed in combination with etch masks in order to remove dielectric compositions from specified regions of the substrate 1.

Still referring to FIG. 1, after forming the gate dielectric layer 4 on the substrate 1, the n-type work function metal layer 15 may be formed directly on the portion of the gate dielectric layer 4 that is overlying the at least one first active region 5 of the substrate 1, and the p-type work function metal layer 20 may be formed directly on the portion of the gate dielectric layer 4 that is overlying the at least second active region 10 of the substrate 1. In one embodiment, the n-type work function metal layer 15 is composed of at least one of TiN, HfN, HfSi, or combinations thereof. The n-type work function metal layer can be deposited using chemical vapor deposition (CVD), atomic layer deposition (ALD), sputtering or plating. In one embodiment, the n-type work function metal layer 15 is composed of TiN, LaO, and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer 15 include DC diode type systems, radio frequency (RF) sputtering, magnetron sputtering, and ionized metal plasma (IMP) sputtering. In one example, an n-type work function metal layer 15 composed of TiN is sputtered from a solid titanium target, in which the nitrogen content of the metal nitride layer is introduced by a nitrogen gas. In another example, an n-type work function metal layer 15 composed of TiN, LaO is sputtered from a solid target comprised of titanium and nitrogen. In one embodiment, the thickness of the n-type work function metal layer 15 may range from 0.1 nm to 4 nm. In another embodiment, the thickness of the n-type work function metal layer 15 may range from 0.2 nm to 2 nm.

In one embodiment, the p-type work function metal layer 20 may be composed of TiAl. The p-type work function metal layer 20 may also be composed of TiAlN, Ru, Pt, Mo, Co and alloys and combinations thereof. In one embodiment, the p-type work function metal layer 20 comprising titanium and aluminum may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer 20 may also be formed using chemical vapor deposition (CVD) and atomic layer deposition (ALD). In one embodiment, the thickness of the p-type work function metal layer 20 may range from 0.1 nm to 5 nm. In another embodiment, the thickness of the p-type work function metal layer 20 may range from 0.2 nm to 2 nm.

In one embodiment, selective etching in combination with etch masks may be employed to provide that the n-type work function metal layer 15 is present only over the at least one first active region 5 and that the p-type work function metal layer 20 is present only over the at least one second active region 10. For example, the n-type metal layer 15 may be blanket deposited on the gate dielectric layer 4 over both the at least one first active region 5 and the at least one second active region 10 of the substrate 1. A first etch mask (not shown) is then formed on a protected portion of the n-type work function metal layer 15 that has been deposited, wherein the protected portion corresponds to the at least one first active region 5 of the substrate 1. The exposed portion of the n-type work function metal layer 15 may then be etched selectively to the first etch mask to provide an exposed portion of the gate dielectric layer 4 that is over the at least one second active region 10 that is not protected by the first etch mask. The first etch mask may then be removed, and the p-type work function metal layer 20 may then formed on the exposed portion of the gate dielectric layer 4 that is over the second active regions 10. A second etch mask in combination with a selective etch process may be employed to remove any portion of the p-type work function metal layer 20 that has been deposited on the n-type work function metal layer 15 present in the at least one first active region 5. The above example of forming the n-type work function metal layer 15 in the at least one first active region 5 and the p-type work function metal 20 in the at least one second active region 10 is provided for illustrative purposes only, and is not intended to limit the present disclosure, as any combination of deposition, photolithography and etch process sequences is within the scope of the present disclosure. In one embodiment, the n-type work function metal layer 15 and the p-type work function metal layer 20 are in direct contact over the interface between the at least one first active region 5 and the at least one second active region 10.

FIG. 1 further depicts forming a replacement metal nitride layer 6 on the upper surface of the n-type work function metal layer 15 and the p-type work function metal layer 20, and forming a replacement semiconductor gate conductor layer 7 on the replacement metal nitride layer 6. The term "replacement" as used to describe the replacement metal nitride layer 6 and the replacement semiconductor gate conductor layer 7 denotes that these material layers are not present in the final structure that is produced by the method sequenced that is described with reference to FIGS. 1-5c. In some embodiments, the replacement semiconductor gate conductor layer 7 and the replacement metal nitride layer 6 protect the underlying portions of the n-type work function metal layer 15 and the p-type work function metal layer 20 during high temperature processes, such as high temperature diffusion annealing. In some embodiments, the replacement semiconductor gate conductor layer 7 and the replacement metal nitride layer 6 are optional, and may be omitted.

In one embodiment, the replacement metal nitride layer 6 is composed of tantalum nitride (TaN), titanium nitride (TiN), tungsten nitride (WN), or combinations thereof. The replacement metal nitride layer 6 may be deposited by chemical vapor deposition (CVD) or physical vapor deposition (PVD). In one embodiment, the thickness of the replacement metal nitride layer 6 may range from 1 nm to 50 nm. In another embodiment, the thickness of the replacement metal nitride layer 6 may range from 2 nm to 20 nm.

The replacement semiconductor gate conductor layer 7 may be composed of a silicon containing material. For example, the replacement semiconductor gate conductor layer 7 may be composed of polysilicon. The replacement semiconductor gate conductor layer 7 may be deposited by chemical vapor deposition (CVD), such as atmospheric pressure CVD (APCVD), low pressure CVD (LPCVD) and plasma enhanced CVD (EPCVD), metal-organic CVD (MOCVD) and others. In one embodiment, the thickness of the replacement semiconductor gate conductor layer 7 may range from 5 nm to 50 nm. In another embodiment, the thickness of the replacement semiconductor gate conductor layer 7 may range from 5 nm to 20 nm.

Figure 2A:
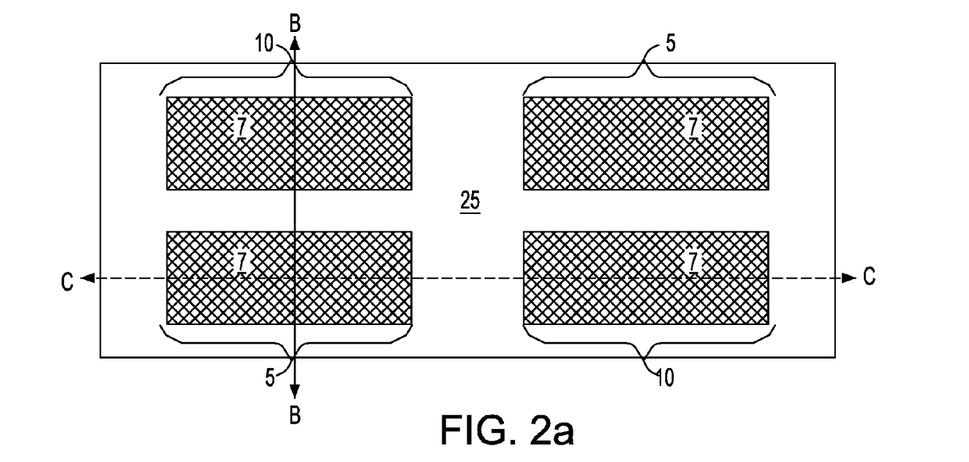
FIGS. 2a-2c depict forming an isolation region into the substrate at an interface between the at least one first active region and the at least one second active region following the formation of the first work function metal layer and the second work function metal layer, in accordance with one embodiment of the present disclosure.
Figure 2B:
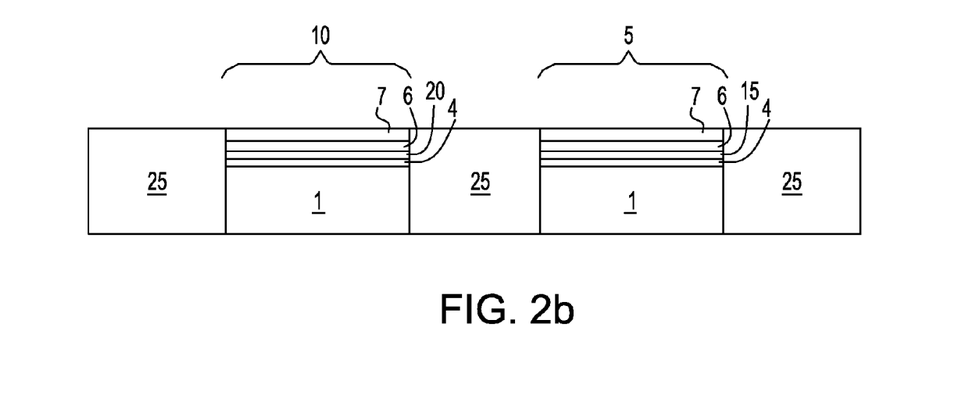
Figure 2C:
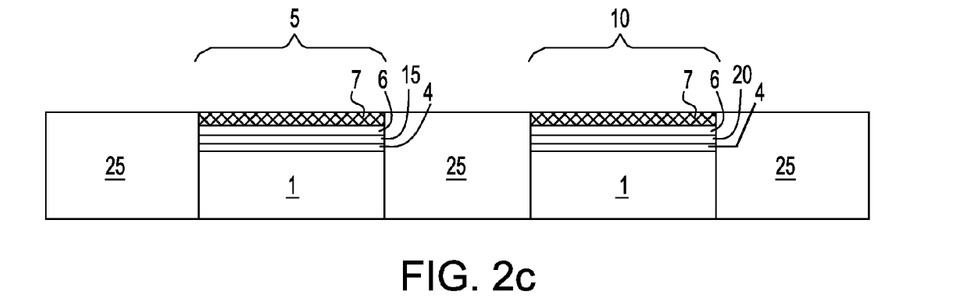

FIGS. 2a-2c depict forming an isolation region 25 into the substrate 1 at an interface between the at least one first active region 5 and the at least one second active region 10 following the formation of the n-type work function metal layer 15 and the p-type work function metal layer 20. In one embodiment, forming the isolation region 25 may include etching the substrate 1 to provide a trench that defines islands of the at least one first active region 5 and the at least one second active region 10. Adjacent islands of the at least one first active region 5 and the at least one second active region 10 are separated from one another by the isolation region 25. Although FIG. 2A only depicts two islands of the at least one first active region 5 and only two islands of the at least one second active region 10, the present disclosure is not limited to only this example, as any number of islands of the at least one first active region 5 and the at least one second active region 10 are within the scope of the present disclosure.

To provide the isolation region 25, a trench is formed into the substrate 1 through the replacement semiconductor gate conductor layer 7, the replacement metal nitride layer 6, the n-type work function metal layer 15, the p-type work function metal layer 20 and gate dielectric 4. In one embodiment, the trench is formed using a dry etching process. In some embodiments, an etch mask (not shown) may be employed to dictate which surfaces are being etched. The etch mask may be formed using deposition and photolithography. More specifically, a pattern is produced over substrate 1 by applying a photoresist to the surface to be etched, exposing the photoresist to a pattern of radiation, and then developing the pattern into the photoresist utilizing a resist developer. Once the patterning of the photoresist is completed, the sections covered by the etch mask composed of the photoresist are protected, while the underlying structures exposed by the opening in the etch mask are removed using a selective etching process. As used herein, the term "selective" in reference to a material removal process denotes that the rate of material removal for a first material is greater than the rate of removal for at least another material of the structure to which the material removal process is being applied. For example, a first material may be removed with a selectivity of greater than 100:1 to a second material.

The etch process for forming the trench may also be anisotropic. As used herein, an "anisotropic etch process" denotes a material removal process in which the etch rate in the direction normal to the surface to be etched is much higher than in the direction parallel to the surface to be etched. Examples of anisotropic etch process suitable for forming the trench include, but are not limited to, reactive-ion etching (RIE), ion beam etching, plasma etching and/or laser ablation. Reactive ion etch (RIE) is a form of plasma etching, in which the surface to be etched may be placed on an RF powered electrode and takes on a potential that accelerates an etching species, which is extracted from a plasma, towards the surface to be etched, wherein a chemical etching reaction takes place in the direction normal to the surface being etched. In one embodiment, the etch process removes an exposed portion of the replacement semiconductor gate conductor 7, an exposed portion of the replacement metal nitride layer 6, an exposed portion of the n-type and p-type work function metal layers 15, 20, an exposed portion of the gate dielectric layer 4, and the exposed portion of the substrate 1 selectively to the etch mask.

Following formation of the trench, the trench is filled with a dielectric to provide the isolation region 25. Prior to deposition of the fill dielectric, the trenches may be lined with a liner material that may function as a diffusion barrier (not shown), e.g., a silicon nitride liner. The diffusion barrier may be a conformally deposited material that is present on the base and sidewalls of the trench. The term "conformal" denotes a layer having a thickness that does not deviate from greater than or less than 20% of an average value for the thickness of the layer. The term "conformally deposited" denotes a deposition method that forms a conformal layer. In one embodiment, the thickness of the diffusion barrier on the sidewalls and base of the trench ranges from 0.1 nm to 20 nm. In another embodiment, the thickness of the diffusion barrier on the sidewalls and base of the trench ranges from 0.2 nm to 5 nm.

Following formation of the diffusion barrier, the fill dielectric may then be deposited within the trench to provide the isolation region 25. Chemical vapor deposition (CVD) or another like deposition process may be used to fill the trench with a dielectric material, such as silicon oxide ($SiO_2$). In addition to silicon oxide, other dielectrics that are suitable for filling the trench to provide the isolation region 25 include silicon oxide ($SiO_2$). Chemical Vapor Deposition (CVD) methods suitable for filling the trench with the dielectric material include atmospheric pressure CVD (APCVD), low pressure CVD (LPCVD), plasma enhanced CVD (PECVD), high density plasma CVD (HDPCVD) metal-organic CVD (MOCVD) and others. The dielectric that is deposited within the trench may optionally be densified after deposition. A planarization process, such as chemical-mechanical polishing (CMP), may optionally be used to provide a planar structure.

Referring to FIGS. 2B and 2C and in one embodiment, the upper surface of the dielectric fill that is deposited within the trench is planarized until the upper surface of the dielectric fill for the isolation region 25 is coplanar with the upper surface of the replacement semiconductor gate conductor layer 7 that is present in the at least one first active region 5 and the at least one second active region 10.

Following the formation of the isolation region 25, in some embodiments, a drive-in (diffusion) anneal is conducted to diffuse the dopant from the n-type word function metal layer 15 and the p-type work function metal layer 20 into the underlying channel region of the at least one first active region 5 and the at least one second active region 10. During drive-in anneal, work functional gate metal will form desired compound configuration, and achieve the desired work function for both n-type semiconductor devices, e.g., NFET, and p-type semiconductor devices, e.g., PFET. In one embodiment, the drive-in (diffusion) anneal is provided by rapid thermal anneal (RTA), flash lamp anneal, furnace anneal or laser annealing. The temperature of the drive-in anneal may range from 800° C. to 1200° C. In another embodiment, the temperature of the drive-in anneal may range from 950° C. to 1050° C. Following the drive-in anneal, the sacrificial semiconductor gate conductor layer 7 and the sacrificial metal nitride layer 6 are removed. In one embodiment, the sacrificial semiconductor gate conductor layer 7 and the sacrificial metal nitride layer 6 are removed by an etch that is selective to the isolation region 25, the n-type work function metal layer 15, and the p-type work function metal layer 20.

FIGS. 3a-4c depict one embodiment of forming a gate stack 50 across the isolation region 25 from the at least one first active region 5 to the at least one second active region 10 of the substrate 1. The gate stack 50 includes a functional semiconductor gate conductor layer 30 and a functional metal nitride layer 35. The functional semiconductor gate conductor layer 30 and the functional metal nitride layer 35 are substituted for the replacement semiconductor gate conductor layer 7 and the replacement metal nitride layer 6, and are present in the final semiconductor device. More specifically, the gate stack 50 of the functional semiconductor gate conductor layer 30 and the functional metal nitride layer 35 are present in the functional gate structure for each of the n-type and p-type semiconductor devices that are present in the at least one first active region 5 and the at least one second active region 10. A "functional gate structure" means a structure used to control output current (i.e., flow of carriers in the channel) of a semiconducting device through electrical or magnetic fields. The other components of the functional gate structure for the semiconductor devices, e.g., n-type semiconductor devices, in the at least one first active region 5 include the n-type work function metal layer 15 and the gate dielectric layer 4. The other components of the functional gate structure for the semiconductor devices, e.g., p-type semiconductor devices, in the at least one second active region 10 include the p-type work function metal layer 20 and the gate dielectric layer 4. The gate stack 50 of the functional semiconductor gate conductor layer 30 and the functional metal nitride layer 35 is in contact with the n-type work function metal layer 15 on the at least one first active region 5 and the p-type work function metal layer 20 on the at least one second active region 10.

Figure 3A:
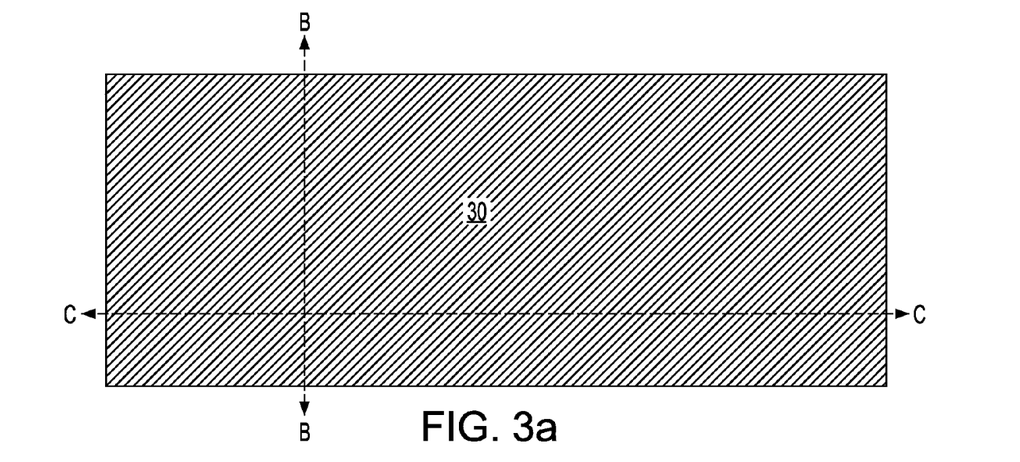
FIGS. 3a-3c depict depositing a blanket layer of a metal nitride layer on the structure depicted in FIGS. 2a-2c, wherein the metal nitride layer is in direct contact with at least the first work function metal layer, the second work function metal layer, and the isolation region, and depositing a blanket layer of the at least one semiconductor gate conductor layer on the metal nitride layer, in accordance with one embodiment of the present disclosure.
Figure 3B:
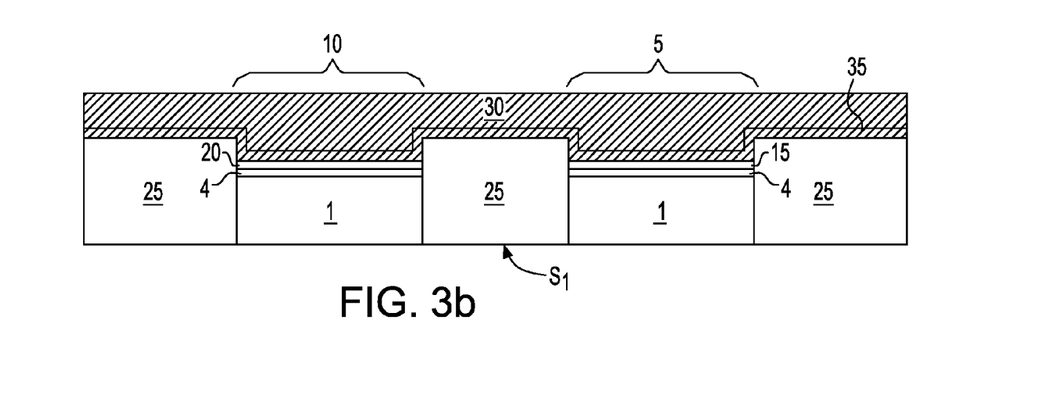
Figure 3C:
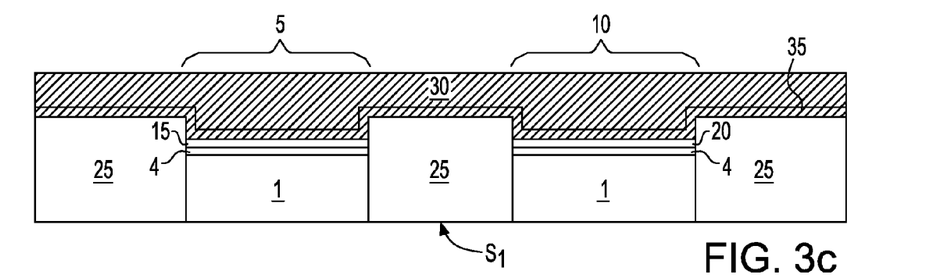

FIGS. 3a-3c depict one depict depositing a blanket layer of the functional metal nitride layer 35 in direct contact with at least one the n-type work function metal layer 15, the p-type work functional metal layer 20, and the isolation region 25, and depositing a blanket layer of the at least one functional semiconductor gate conductor layer 30 on the metal nitride layer 35. Referring to FIGS. 3b and 3c, the functional metal nitride layer 35 is a conformally deposited layer that is present on the upper surfaces of the isolation region 25, and the upper surface of the exposed n-type work function metal layer 15 and the exposed p-type work function metal layer 20, which are vertically offset and recessed relative to the upper surface of the isolation region 25. The upper surface of the n-type work function metal layer 15 and/or the p-type work function metal layer 20 is vertically offset and recessed away from the upper surface of the isolation region 15 towards a back surface S1 of the substrate 1. The functional metal nitride layer 35 is also present on the sidewalls of the isolation region 25 that extend from the upper surface of the isolation region 25 to the upper surface of the n-type work function metal layer 15 and/or the upper surface of the p-type work function metal layer 20. In some embodiments, the functional metal nitride layer 35 is a single, continuous material layer having a single composition. In one embodiment, the functional metal nitride layer 35 is composed of titanium nitride, tantalum nitride, tungsten nitride or a combination thereof. The functional metal nitride layer 35 may have a thickness ranging from 1 nm to 20 nm. In another embodiment, the functional metal nitride layer 35 may have a thickness ranging from 1 nm to 5 nm. The functional metal nitride layer 35 may be deposited using a chemical vapor deposition method, such as atmospheric pressure CVD (APCVD), low pressure CVD (LPCVD), plasma enhanced CVD (PECVD), high density plasma CVD (HD-PCVD) metal-organic CVD (MOCVD) and others.

The functional metal nitride layer that is depicted in FIGS. 3a-3c is similar to the replacement metal nitride layer that is described above with reference to FIGS. 2a-2c. Therefore, the process details for forming the replacement metal nitride layer 6 are suitable for forming the functional metal nitride layer 35.

Following the formation of the functional metal nitride layer 35, a functional semiconductor gate conductor layer 30 is blanket deposited directly on the functional metal nitride layer 35. The functional semiconductor gate conductor layer 30 is deposited over the at least one first active region 5, the at least one second active region 10 and the isolation region 25. The functional semiconductor gate conductor layer 30 may be composed of a silicon containing material. Examples of silicon containing materials suitable for the functional semiconductor gate conductor layer 30 include, but are not limited to, silicon, single crystal silicon, polycrystalline silicon, silicon germanium, and amorphous silicon. The functional semiconductor gate conductor layer 30 may have a thickness ranging from 2 nm to 10 nm. In another embodiment, functional semiconductor gate conductor layer 30 may have a thickness ranging from 2 nm to 5 nm.

In one embodiment, the functional semiconductor gate conductor layer 30 is provided by a doped semiconductor, such as n-type doped polysilicon. Although the functional semiconductor gate conductor layer 30 is depicted as being a single material layer, that the functional semiconductor gate conductor layer 30 may be composed of any number of semiconductor layers having any number of compositions.

In one embodiment, the functional semiconductor gate conductor layer 30 is deposited and then doped by ion implantation. The material for the functional semiconductor gate conductor layer 30 may be deposited using chemical vapor deposition (CVD). Variations of CVD processes suitable for depositing the functional semiconductor gate conductor layer 30 include, but are not limited to, Atmospheric Pressure CVD (APCVD), Low Pressure CVD (LPCVD) and Plasma Enhanced CVD (EPCVD), Metal-Organic CVD (MOCVD) and others. The functional semiconductor gate conductor layer 30 may be doped using ion implantation following the deposition of the material for the functional semiconductor gate conductor layer 30. In another embodiment, the functional semiconductor gate conductor layer 30 may be in-situ doped as the material layer for the functional semiconductor gate conductor layer 30 is formed. In one embodiment, the doping concentration in the functional semiconductor gate conductor layer 30 ranges from $5 \times 10^{18}$ to $5 \times 10^{20}$ cm$^{-3}$.

Figure 4A:
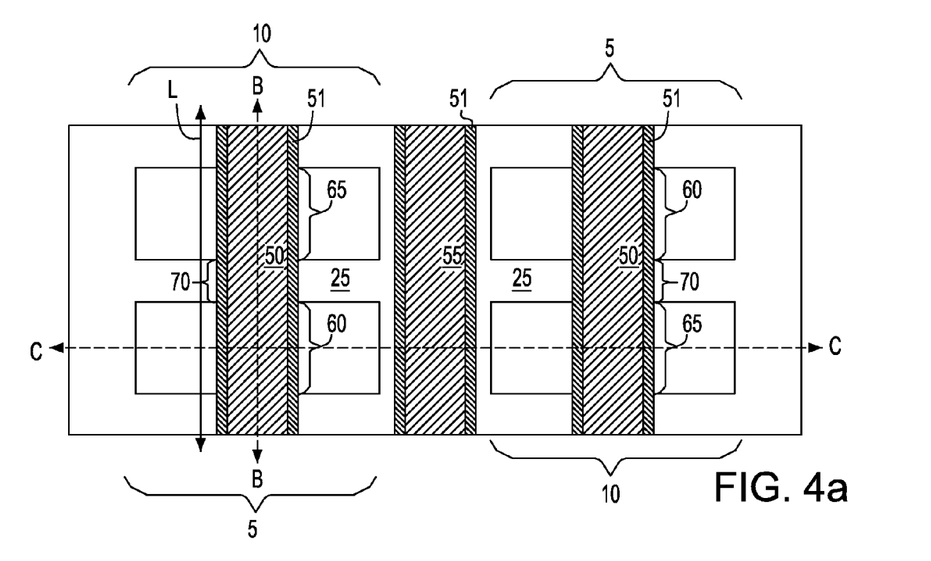
FIGS. 4a-4c depict etching the blanket layer of the metal nitride layer and the blanket layer of the at least one semiconductor gate conductor layer to provide a gate stack spanning across the isolation region from the at least one first active region to the at least one second active region of the substrate, wherein the gate stack is in contact with the first work function metal layer and the second work function metal layer, in accordance with one embodiment of the present disclosure.
Figure 4B:
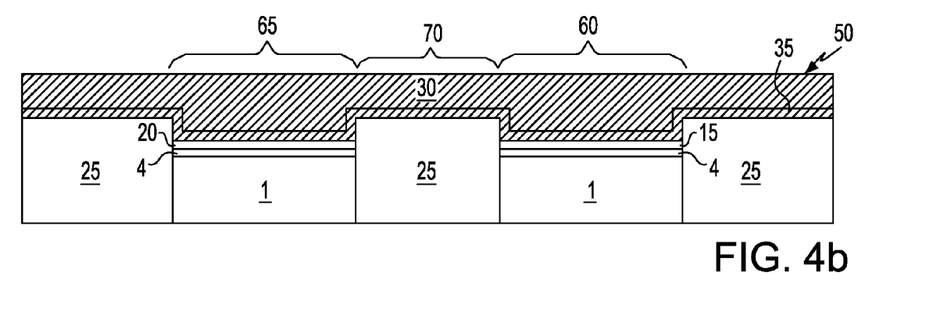
Figure 4C:
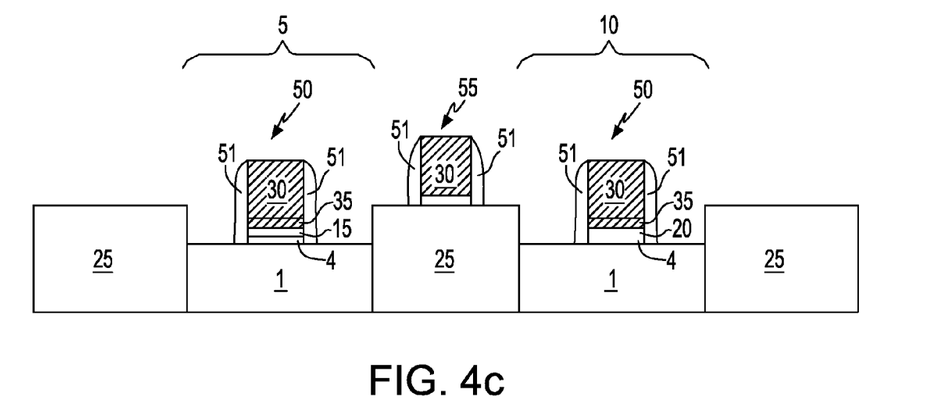

FIGS. 4a-4c depict one embodiment of etching the blanket layer of the functional semiconductor gate conductor layer 30 and the blanket layer of the functional metal nitride layer 35 to provide a gate stack 50 spanning across the isolation region 25 from the at least one first active region 5 to the at least one second active region 10 of the substrate 1. In one embodiment, forming the gate stack 50 from the blanket layers of the functional semiconductor gate conductor layer 30 and the functional metal nitride layer 35 include, photolithography and a selective etching process. Specifically, an etch mask composed of photoresist is produced by applying a photoresist layer to the surface to be etched, exposing the photoresist layer to a pattern of radiation, and then developing the pattern into the photoresist utilizing a resist developer. Once the patterning of the photoresist is completed to form the etch mask, the sections covered by the etch mask are protected while the exposed regions are removed using a selective etching process that removes the unprotected regions. The portions of the blanket layer of the functional semiconductor gate conductor layer 30 and the blanket layer of the functional metal nitride layer 35 that are protected by the etch mask are directly over the first channel region of the at least one first active region 5, and the second channel region of the at least one second active region 10.

Following formation of the etch mask on the functional semiconductor gate conductor layer 30, the exposed portions of the functional semiconductor gate conductor layer 30, and the underlying portions of the functional metal nitride layer 35, the n-type work function metal layer 15, the p-type work function metal layer 20, and the gate dielectric layer 4 are etched to form the gate stack 50 and expose portions of the at least one first active region 5 and the at least one second active region 20 in which the source regions and drain regions are to be formed. Examples of anisotropic etch process suitable for forming the gate stack 50 include, but are not limited to, reactive-ion etching (RIE), ion beam etching, plasma etching and/or laser ablation. The etch process for forming the gate stack 50 may be selective to the etch mask, the isolation region 35 and the semiconductor substrate 1 in the at least one first active region 5 and the at least one second active region 10. Referring to FIG. 4a, the gate stack 50 may have a length L1 that is perpendicular to the length of the first and second channel region in the first active regions 5 and/or second active regions 20.

Each gate stack 50 may include a first portion that is present on the at least one first active region 5 and a second portion that is present on the at least one second active region 10. A connecting portion 70 (also referred to as connecting gate structure) of the gate stack 50 is present on the isolation region 25 and provides electrical communication to the first portion 60 and the second portion 65 of the gate stack 50. Referring to FIG. 4b, the first portion 60, connecting portion 70, and second portion 65 of the gate stack 50 are provided by continuous layers of the functional semiconductor gate conductor layer 30 and the functional metal nitride layer 35. Referring to FIGS. 4b and 4c, the first portion 60 of the gate stack 50 is in connection with the n-type work function metal layer 15 and the gate dielectric 4 provide the functional gate structure (also referred to as first gate structure) to the n-type semiconductor devices being formed in the at least one first active region 5, and the second portion of the gate stack 50 in connection with the p-type work function metal layer 20 and the gate dielectric 4 provide the functional gate structure (also referred to as second gate structure) to the p-type semiconductor devices being formed in the at least one first active region 10. Referring to FIGS. 4b and 4c, in one embodiment, the connecting portion 70 (also referred to as connecting gate structure) of the gate stack 50 is present on the isolation region 25, in which the functional metal nitride layer 35 is in direct contact with the upper surface of the isolation region 25. The n-type work function metal layer 15 and the p-type work function metal layer 20 are not present on the isolation region 25 in the connecting portion 70 and the stack 50.

Referring to FIGS. 4a and 4c, in some embodiments, a conductive line 55 is present extending over the isolation region 25, wherein the conductive line 55 does not intersect the at least one first active region 5 and/or the at least one second active region 10. The conductive line 55 includes a functional metal nitride layer 35 and a functional semiconductor gate conductor layer 30. The conductive line 55 does not include the gate dielectric 4, the n-type work function metal layer 15 and the p-type work function metal layer 20. In some embodiments, because the functional semiconductor gate conductor layer 30 and the functional metal nitride layer 35 of the conductive line 55 is the formed from the same blanket deposited layers that provide the functional semiconductor gate conductor layer 30 and the functional metal nitride layer 35 of the gate stack 50 that intersects the at least one first active region 5 and the at least one second active 10, composition of the conductive line 55 may be the same as the composition of the gate stack 50.

Figure 5A:
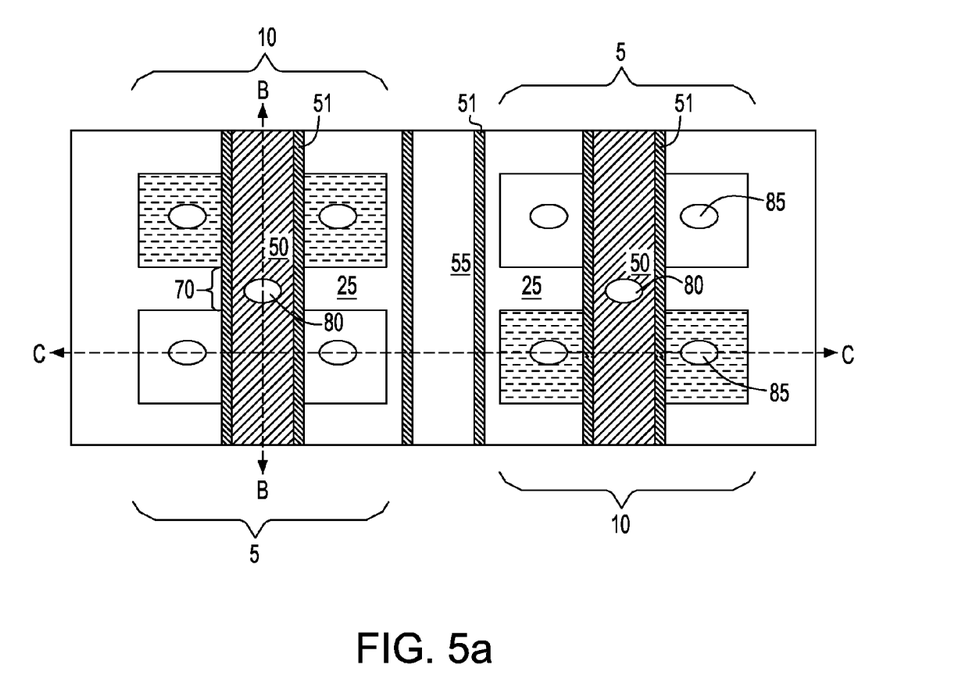
FIGS. 5a-5c depict forming an interconnect to the connecting gate structure of the gate stack that is over the isolation region, in accordance with one embodiment of the present disclosure.
Figure 5B:
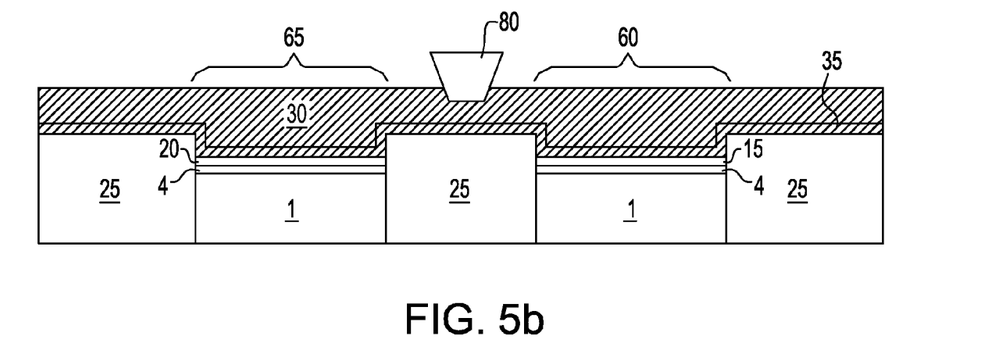
Figure 5C:
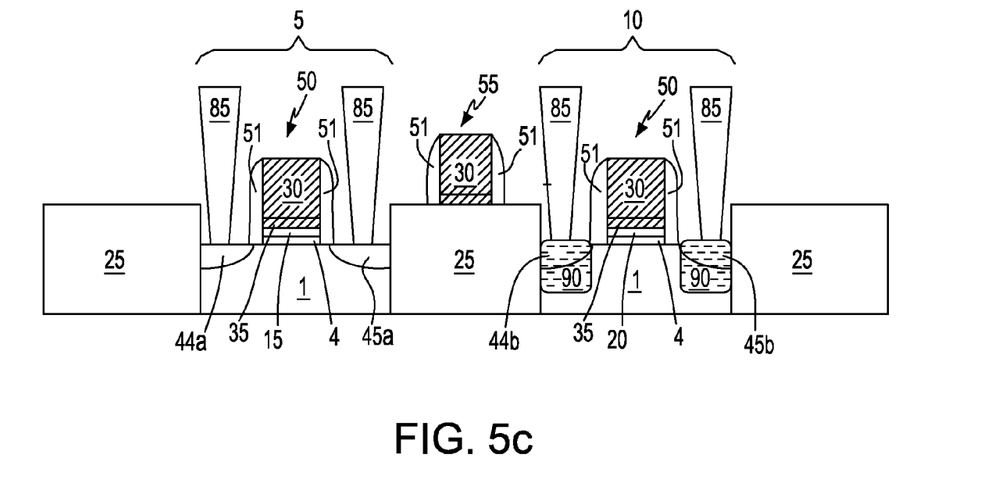

FIGS. 5a-5c depict forming the source and drain regions 44a, 44b, 45a, 45b of the semiconductor devices, e.g., n-type semiconductor devices and p-type semiconductor devices, in the at least one first active region 5 and the at least one second active region 10. As used herein, the term "source" is a doped region in the semiconductor device, in which majority carriers are flowing into the channel region that is underlying the functional gate structure. As used herein, the term "drain" means a doped region in semiconductor device located at the end of the channel, in which carriers are flowing out of the semiconductor through the drain. The source and drain regions 44a, 44b, 45a, 45b in the at least one first active region 5 are doped to an n-type conductivity to provide an n-type semiconductor device. The source and drain regions 44a, 44b, 45a, 45b in the at least one second active region 10 are doped to a p-type conductivity to provide a p-type semiconductor device.

In some embodiments, prior to forming the source and drain regions 44a, 44b, 45a, 45b, compressive stress inducing wells 90 composed of silicon germanium (SiGe) may be formed on opposing sides of the gate stack 50. The term "compressive stress inducing wells" denotes that the material contained within the well region is under an intrinsic compressive stress, in which the compressive stress is produced by a lattice mismatch between the larger lattice dimension of the material within the well region, e.g., silicon germanium, and the smaller lattice dimension of the substrate 1, i.e., silicon substrate, on which the silicon germanium is epitaxially grown. The compressive stress inducing wells 90 induce a compressive stress within the channel region that is between the compressive stress inducing wells. Compressive stress within the channel regions of the semiconductor device increase hole carrier mobility when compared to channel regions that are under a tensile stress or a neutral stress. Therefore, the compressive stress inducing wells 90 are positioned in the at least one second active regions 10, in which the p-type semiconductor devices are present.

In a first process step, a recess is formed within the portion of the substrate 1 in at least one second active region 10 on opposing sides of the functional gate structure, in which the source and drain regions 43a, 43b, 44a, 44b are positioned. The recess may be formed using photolithography and etching. Specifically an etch mask, such as a patterned photoresist mask, is formed atop the surface of the entire structure except the portions of the at least one second active region 10 that are adjacent to the functional gate structure. An anisotropic etch process then recesses the exposed surface of the substrate 1 in the at least one first region 5 and the at least one second region 10 to a depth of ranging from 10 nm to 300 nm, as measured from the surface of the substrate 1 on which the gate dielectric layer 4 is present. Although the following description refers to the compressive stress inducing wells 90 as being composed of silicon germanium, it is noted that the compressive stress inducing wells 90 may be composed of any semiconductor material that may be epitaxially grown on the material of the substrate 1, and has a greater lattice dimension than the lattice dimension of the substrate 1.

In a next process step, silicon germanium is then epitaxially grown atop the recessed surface of the substrate 1 to provide the compressive stress including wells 90. The terms "epitaxial grown" and "epitaxially formed" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the substrate 1 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, the depositing atoms have no surface to align to, resulting in the formation of polysilicon instead of single crystal silicon. The temperature for epitaxial deposition typically ranges from 550° C. to 900° C. Although higher temperature typically results in faster deposition, the faster deposition may result in crystal defects and film cracking.

A number of different sources may be used for the deposition of epitaxial silicon germanium on the recess to provide the compressive stress inducing wells 90. In some embodiments, the gas source for the deposition of epitaxial silicon germanium may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxially deposited silicon germanium that provides the compressive stress inducing wells 90 may range from 5% to 70%, by atomic weight %. In another embodiment, the germanium content of the epitaxially formed silicon germanium may range from 10% to 40%.

Although not depicted in the figures, tensile stress inducing wells may be formed in the at least one first active region 5. The term "tensile stress inducing wells" denotes that the material contained within the well region is under an intrinsic tensile stress, in which the tensile stress is produced by a lattice mismatch between the smaller lattice dimension of the material within the well region, e.g., silicon doped with carbon (Si:C), and the larger lattice dimension of the substrate, i.e., silicon substrate, on which the silicon doped with carbon (Si:C) is epitaxially grown. The tensile stress inducing wells induce a tensile stress within the channel region that is between the tensile stress inducing wells. Tensile stress within the channel regions of the semiconductor device increases electron carrier mobility when compared to channel regions that are under a compressive stress or a neutral stress. Therefore, the tensile stress inducing wells may be positioned in the at least one first active regions 5, in which the n-type semiconductor devices are present. The method of forming the tensile stress inducing wells is similar to the method of forming the compressive stress inducing wells 90 that is described above, with the exception that the material within the tensile stress inducing wells is composed of silicon doped with carbon (Si:C). The carbon (C) content of the epitaxial grown silicon doped with carbon may range from 0.3% to 5%, by atomic weight %. In another embodiment, the carbon content of the epitaxial grown silicon doped with carbon may range from 1% to 2%.

Still referring to FIGS. 5a-5c, following the formation of the compressive stress inducing wells 90, and the optional tensile stress inducing wells, the source and drain regions 44a, 44b, 45a, 45b may be formed in the at least one first active region 5 and the at least one second active region 10 by ion implantation. The source and drain regions 44a, 45a in the at least one first active region 5 are doped to an n-type conductivity. In a silicon containing substrate examples of n-type dopants, i.e., impurities, include but are not limited to antimony, arsenic and phosphorous. The source and drain regions 44b, 45b in the at least one second active region 10 are doped to a p-type conductivity. In a silicon-containing substrate, examples of n-type dopants, i.e., impurities, include but are not limited to, boron, aluminum, gallium and indium.

FIGS. 5A and 5B depict one embodiment of forming interconnects 80 to the connecting portion 70 of the gate stack 50 over the isolation region 25, and forming interconnects 85 to the source and drain regions 44a, 44b, 45a, 45b. The interconnects 80, 85 may be formed through an interlevel dielectric layer (not shown) that is blanket deposited over the substrate 1. The interlevel dielectric layer may be selected from the group consisting of silicon containing materials such as $SiO_2$, $Si_3N_4$, $SiO_xN_y$, SiC, SiCO, SiCOH, and SiCH compounds; the above-mentioned silicon containing materials with some or all of the Si replaced by Ge; carbon doped oxides; inorganic oxides; inorganic polymers; hybrid polymers; organic polymers such as polyamides or SILK™; other carbon containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer may then patterned and etched to form via holes to the connecting portion 70 of the gate stack 50 that is present over the isolation region 5, and the source and drain regions 44a, 44b, 45a, 45b that are present in the at least one first active region 5 and the at least one second active region 10. Following via formation, interconnects 80, 85 are formed by depositing a conductive metal into the via holes using deposition methods, such as CVD, sputtering or plating. The conductive metal may include, but is not limited to: tungsten, copper, aluminum, silver, gold and alloys thereof.

In the process flow depicted in FIGS. 1-5c, the gate dielectric layer 4, the n-type work function metal 15, and the p-type work function metal layer 20 are formed prior to the isolation region 25, and the silicon germanium epitaxially formed compressive stress inducing wells 90. In these embodiments, at least a portion of the functional gate structure, i.e., a partial gate structure, is formed prior to the isolation regions 25 and the silicon germanium epitaxially formed compressive stress inducing wells 90. By forming a portion of the functional gate structure prior to forming the isolation region 25, the negative impacts of divot formation and step height variation, which occurs at the interface between the isolation region and the active region, on gate structure formation can be substantially eliminated. The impact of divot formation and step height variation can be eliminated, because in the methods and structures disclosed in FIGS. 1-5c, at least a portion of the gate structure is formed before divot formation and the variations in step height begin. Therefore, in some embodiment, the present disclosure reduces narrow channel effects, and reduces variations in the critical dimensions of the gates structures.

Further, by forming the isolation region 25 after the n-type work function metal layer 15 and after the p-type work function metal layer 20, the isolation region 25 is formed through the n-type work function metal layer 15 and the p-type work function metal layer 20, and therefore isolates the n-type work function metal layer 15 from the p-type work function metal layer 20. Therefore, in some embodiments, by isolating the p-type work function metal layer 15 from the p-type work function metal layer 20, the present disclosure eliminates dopant diffusion between the at least one first active region 5 and the at least one second active region 10 across the isolation region 25. In one embodiment, the diffusion of dopant in gate stack modulate work function, and results in device variation and magnitude of variation varies with device geometry.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

The invention claimed is:

1. A method of forming a semiconductor device comprising:
   providing a substrate including at least one first active region that is in direct contact with at least one second active region;
   forming a first work function metal layer over a first channel region of the at least one first active region of the substrate, and a second work function metal layer over a second channel region of the at least one second active region of the substrate;
   forming an isolation region into the substrate at an interface between the at least one first active region and the at least one second active region following the formation of the first work function metal layer and the second work function metal layer, wherein the isolation region separates the first work function metal layer that is present on the at least one first active region from the second work function metal layer that is present on the at least one second active region; and
   forming a gate stack across the isolation region from the at least one first active region to the at least one second active region of the substrate, the gate stack is in contact with the first work function metal layer on the at least one first active region and the second work function metal layer on the at least one second active region, wherein the gate stack includes at least one metal nitride layer that is present on the at least the first work function metal layer and the second work function metal layer, and at least one semiconductor gate conductor layer that is present on the at least one metal nitride layer.

2. The method of claim 1, wherein the substrate comprises a bulk semiconductor or a semiconductor on insulator (SOI) substrate.

3. The method of claim 1, wherein the at least one first active region in the substrate includes a first conductivity type well and the at least one second active region in the substrate includes a second conductivity type well, wherein forming the first conductivity well and the second conductivity well comprises:
   forming a first block mask over the at least one second active region;
   implanting the at least one first active region with a first conductivity type dopant;
   removing the first block mask;
   forming a second block mask over the at least one first active region;
   implanting the at least one second active region with a second conductivity type dopant; and
   removing the second block mask.

4. The method of claim 1, wherein the first work function metal layer is an n-type work function metal layer that is selected from the group consisting of TiN, HfN, HfSi, LaO, and combinations thereof, and the second work function metal layer is a p-type work function metal layer that is selected from the group consisting of TiAl, TiAlN, Ru, Pt, Mo, Co and alloys and combinations thereof.

5. The method of claim 4, wherein forming of first work function metal layer over the first channel region of the at least one first active region, and the forming of the second work function metal layer over the second channel region of the at least one second active region comprises:
   forming at least one gate dielectric layer on the at least one first active region and the at least one second active region;
   depositing the first work function metal layer on the at least one gate dielectric layer;
   forming a first etch mask on a protected portion of the first work function metal layer that is present over the at least one first active device region, wherein an exposed portion of the first work function metal layer is present over the at least one second active device region;
   etching the exposed portion of the first work function metal layer selective to the second etch mask to provide an exposed portion of the gate dielectric layer over the at least one second active region; and
   forming the second work function metal layer on the exposed portion of the at least one gate dielectric layer.

6. The method of claim 5, wherein the forming of the isolation region into the substrate at the interface between the at least one first active region and the at least one second active region comprises:
   forming a second etch mask having an opening to an exposed portion of the at least one of the first work function metal layer and the second work function metal layer at the interface between the at least one first active region and the at least one second active region;
   etching the exposed portion of the at least one of the first work function metal layer and the second work function metal layer selectively to the etch mask to expose an underlying portion of the at least one gate dielectric layer;
   etching an exposed portion of the at least one gate dielectric layer and an underlying portion of the substrate to provide a trench at the interface between the at least one first active region and the at least one second active region;
   forming a diffusion barrier within the trench; and
   filling the trench with a dielectric to provide the isolation region.

7. The method of claim 6, wherein the forming of the gate stack across the isolation region from the at least one first active region to the at least one second active region of the substrate comprises:
   depositing a blanket layer of the metal nitride layer in direct contact with the first work function metal layer, the second work function metal layer, and the isolation region;
   depositing a blanket layer of the at least one semiconductor gate conductor layer on the metal nitride layer;
   etching the blanket layer of the metal nitride layer and the blanket layer of the at least one semiconductor gate conductor layer to provide the gate stack; and
   etching the first work function metal layer, the second work function metal layer, the at least one gate dielectric layer, wherein a remaining portion of the first work function metal layer is only present over the first channel region of at least one first active region of the substrate, and a remaining portion of the second work function metal layer is only present over the second channel region of at least one second active region of the substrate.

8. The method of claim 1, wherein an n-type semiconductor device is present on the at least one first active region and a p-type semiconductor device is present on the at least one second active region, wherein the at least one second active region includes embedded silicon germanium regions on opposing sides of the gate stack.

9. A complementary metal oxide semiconductor (CMOS) device comprising:
- a substrate including at least one first active region and at least one second active region, wherein the at least one first active region is separated from the at least one second active region by an isolation region;
- an n-type semiconductor device present on the at least one first active region, wherein the n-type semiconductor device includes a first gate structure that is present on a first channel region of the at least one first active region, the first gate structure is comprised of a first gate dielectric layer and an n-type work function metal layer, wherein the n-type work function layer does not extend onto the isolation region;
- a p-type conductivity semiconductor device present on the at least one second active region, wherein the p-type conductivity semiconductor device includes a second gate structure that is present on a second channel region of the at least one second active region, the second gate structure is comprised of a second gate dielectric layer and a p-type work function metal layer, wherein the p-type work function layer does not extend onto the isolation region; and
- a connecting gate structure that extends across the isolation region into direct contact with the first gate structure and the second gate structure.

10. The CMOS device of claim 9, wherein an n-type source region and an n-type drain region is present on opposing sides of the first channel region in the at least one first active region, and a p-type source region and a p-type drain region is present on opposing sides of the second channel region in the at least one second active region.

11. The CMOS device of claim 9, wherein the connecting gate structure has a length extending from the first channel region of the at least one first active region to the second channel region of the at least one second active region, wherein the length of the connecting gate portion is perpendicular to a channel length that extends from the p-type source region to the p-type drain region or from the n-type source region to the n-type drain region.

12. The CMOS device of claim 9, wherein the connecting gate structure includes a metal nitride layer and a semiconductor gate conductor layer.

13. The CMOS device of claim 12, wherein the metal nitride layer extends continuously across the at least one first active region along the first channel region across an upper surface of the isolation region and across the at least one second active region along the second channel region.

14. The CMOS device of claim 12, wherein at least one of an upper surface of the n-type work function metal layer and the p-type work function metal layer is vertically offset and recessed away from an upper surface of the isolation region towards a back surface of the substrate.

15. The CMOS device of claim 12, wherein the n-type work function metal layer is selected from the group consisting of TiN, HfN, HfSi, LaO and combinations thereof, and the second work function metal layer is a p-type work function metal layer that is selected from the group consisting of TiAl, TiAlN, Ru, Pt, Mo, Co and alloys and combinations thereof.

16. The CMOS device of claim 15, wherein the metal nitride layer is selected from the group consisting of tungsten nitride (WN), titanium nitride (TiN), tantalum nitride (TaN), TiSi, WSi and combinations thereof.

17. The CMOS device of claim 16, wherein the semiconductor gate conductor layer comprises doped polysilicon.

18. The CMOS device of claim 11, wherein an interconnect to the connecting gate structure is over the isolation region.

19. A complementary metal oxide semiconductor (CMOS) device comprising:
- a substrate including at least one first active region and at least one second active region;
- an n-type semiconductor device present on the at least one first active region, wherein the n-type semiconductor device includes a first gate structure that is present on a first channel region of the at least one first active region, the first gate structure is comprised of a first gate dielectric layer and an n-type work function metal layer;
- a p-type conductivity semiconductor device present on the at least one second active region, wherein the p-type conductivity semiconductor device includes a second gate structure that is present on a second channel region of the at least one second active region, the second gate structure is comprised of a second gate dielectric layer and a p-type work function metal layer; and
- a connecting gate structure is in direct contact with the first gate structure and the second gate structure.

* * * * *